(12) United States Patent
Takahashi

(10) Patent No.: US 9,349,811 B2
(45) Date of Patent: May 24, 2016

(54) FIELD PLATE CONFIGURATION OF A SEMICONDUCTOR DEVICE

(75) Inventor: Tetsuo Takahashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 24 days.

(21) Appl. No.: 13/619,565

(22) Filed: Sep. 14, 2012

(65) Prior Publication Data

US 2013/0161645 A1  Jun. 27, 2013

(30) Foreign Application Priority Data

Dec. 26, 2011 (JP) .................................. 2011-283871

(51) Int. Cl.
| | |
|---|---|
| *H01L 29/15* | (2006.01) |
| *H01L 29/40* | (2006.01) |
| *H01L 29/739* | (2006.01) |
| *H01L 29/06* | (2006.01) |
| *H01L 29/08* | (2006.01) |

(52) U.S. Cl.
CPC ............ *H01L 29/404* (2013.01); *H01L 29/063* (2013.01); *H01L 29/0615* (2013.01); *H01L 29/0834* (2013.01); *H01L 29/7395* (2013.01)

(58) Field of Classification Search
CPC . H01L 29/063; H01L 29/404; H01L 29/7395; H01L 29/0834; H01L 29/0615; H01L 29/0634
USPC .......................................................... 257/77
See application file for complete search history.

(56) References Cited

U.S. PATENT DOCUMENTS

| | | |
|---|---|---|
| 5,455,439 A | 10/1995 | Terashima et al. |
| 2003/0006497 A1 | 1/2003 | Hiyoshi et al. |
| 2006/0131685 A1 | 6/2006 | Watanabe et al. |
| 2010/0252904 A1 * | 10/2010 | Takahashi et al. ............ 257/492 |

(Continued)

FOREIGN PATENT DOCUMENTS

| | | |
|---|---|---|
| DE | 102010011258 A1 | 10/2010 |
| JP | 5-190693 A | 7/1993 |

(Continued)

OTHER PUBLICATIONS

The Institute of Electrical Engineers of Japan (1996), "Power Semiconductor Device and Power IC Handbook", (pp. 54-65, 170-175), Tokyo, Japan: Corona Publishing Co., Ltd.
An Office Action issued by the German Patent Office on Mar. 5, 2014, which corresponds to German Patent Application No. 10 2012 219 644.7 and is related to U.S. Appl. No. 13/619,565; with English language translation.

(Continued)

*Primary Examiner* — Thao X Le
*Assistant Examiner* — Laura Dykes
(74) *Attorney, Agent, or Firm* — Studebaker & Brackett PC

(57) ABSTRACT

A semiconductor device includes a semiconductor substrate having a principal surface, and an insulating film formed on the principal surface and continuously covering a top surface of a first boundary region and a top surface of a second boundary region, the first boundary region including a boundary between a well layer and a RESURF layer, the second boundary region including a boundary between the RESURF layer and a first impurity region. The semiconductor device further includes a plurality of lower field plates formed in the insulating film in such a manner that the plurality of lower field plates do not lie directly above the first and second boundary regions, and a plurality of upper field plates formed on the insulating film in such a manner that the plurality of upper field plates do not lie directly above the first and second boundary regions.

10 Claims, 13 Drawing Sheets

(56) References Cited

U.S. PATENT DOCUMENTS

2010/0264507 A1\* 10/2010 Takahashi .......... H01L 29/0619
257/491
2011/0233714 A1 9/2011 Lu

FOREIGN PATENT DOCUMENTS

| JP | 2002-231944 A | 8/2002 |
|----|---------------|--------|
| JP | 2002-261283 A | 9/2002 |
| JP | 2006-173437 A | 6/2006 |
| JP | 2008-103529 A | 5/2008 |
| JP | 2010-245281 A | 10/2010 |
| JP | 2011-199223 A | 10/2011 |
| JP | 2011-204710 A | 10/2011 |
| KR | 10-2010-0111235 A | 10/2010 |

OTHER PUBLICATIONS

An Office Action issued by the Korean Intellectual Property Office on Jul. 30, 2014, which corresponds to Korean Patent Application No. 10-2012-0139329 and is related to U.S. Appl. No. 13/619,565; with partial English translation.

An Office Action; "Notification of Reason for Rejection," issued by the Japanese Patent Office on Apr. 22, 2014, which corresponds to Japanese Patent Application No. 2011-283871 and is related to U.S. Appl. No. 13/619,565; with English language partial translation.

An Office Action issued by the Korean Intellectual Property Office on Nov. 28, 2013, which corresponds to Korean Patent Application No. 10-2012-0139329 and is related to U.S. Appl. No. 13/619,565; with partial English translation.

\* cited by examiner first boundary region: boundary region between the well layer 22 and RESURF layer 24
second boundary region: boundary region between the RESURF layer 24 and first impurity region 21 x : impurity region formed by ion implantation x : impurity region formed by ion implantation

FIELD PLATE CONFIGURATION OF A SEMICONDUCTOR DEVICE

BACKGROUND OF THE INVENTION

1. Field of the Invention

The present invention relates to a semiconductor device used, e.g., for power conversion, power control, etc.

2. Background Art

Japanese Laid-Open Patent Publication No. 2010-245281 discloses a semiconductor device having a field plate structure and a RESURF layer formed therein. The field plate structure and the RESURF layer are formed in the periphery of the semiconductor device in order to increase the breakdown voltage of the device.

It is desirable to minimize the size of semiconductor devices while maintaining the breakdown voltage at a high enough level. Therefore, there is a need to provide a semiconductor device which is smaller than the semiconductor device disclosed in the above-mentioned patent publication and which yet has an adequately high breakdown voltage.

SUMMARY OF THE INVENTION

The present invention has been made to solve this problem. It is, therefore, an object of the present invention to provide a semiconductor device of reduced size, yet having an adequately high breakdown voltage.

According to one aspect of the present invention, a semiconductor device includes a semiconductor substrate having a principal surface, a first impurity region of a first conductivity type formed in the semiconductor substrate, a RESURF layer of a second conductivity type formed in the semiconductor substrate along the principal surface, a well layer of the second conductivity type formed in the semiconductor substrate adjacent the RESURF layer and along the principal surface, a channel stopper of the first conductivity type formed in the semiconductor substrate adjacent the RESURF layer and along the principal surface, with the first impurity region interposed between the channel stopper and the RESURF layer, an insulating film formed on the principal surface and continuously covering a top surface of a first boundary region and a top surface of a second boundary region, the first boundary region including a boundary between the well layer and the RESURF layer, the second boundary region including a boundary between the RESURF layer and the first impurity region, a plurality of lower field plates formed in the insulating film in such a manner that the plurality of lower field plates do not lie directly above the first and second boundary regions, and a plurality of upper field plates formed on the insulating film in such a manner that the plurality of upper field plates do not lie directly above the first and second boundary regions.

According to another aspect of the present invention, a semiconductor device includes a semiconductor substrate having a principal surface, a first impurity region of a first conductivity type formed in the semiconductor substrate, a well layer of a second conductivity type formed in the semiconductor substrate along the principal surface, a channel stopper of the first conductivity type formed in the semiconductor substrate away from the well layer and along the principal surface, and a RESURF layer formed in the semiconductor substrate between the well layer and the channel stopper and along the principal surface, and having an impurity concentration of the second conductivity type which gradually decreases away from the well layer toward the channel stopper.

According to another aspect of the present invention, a semiconductor device includes a semiconductor substrate having a principal surface, a first impurity region of a first conductivity type formed in the semiconductor substrate, a RESURF layer of a second conductivity type formed in the semiconductor substrate and along the principal surface, a well layer of the second conductivity type formed in the semiconductor substrate adjacent the RESURF layer and along the principal surface, a concentration gradient reducing section formed in the portion of the well layer adjacent the RESURF layer in such a manner that the impurity concentration gradient of the second conductivity type between the well layer and the RESURF layer is reduced, and a gate wire formed directly above the concentration gradient reducing section.

Other and further objects, features and advantages of the invention will appear more fully from the following description.

DETAILED DESCRIPTION OF THE PREFERRED EMBODIMENTS

Embodiments of the present invention will be described with reference to the accompanying drawings. It should be noted that the semiconductor device of each of these embodiments will be specifically described in connection with an IGBT (insulated gate bipolar transistor).

First Embodiment

Figure 1:
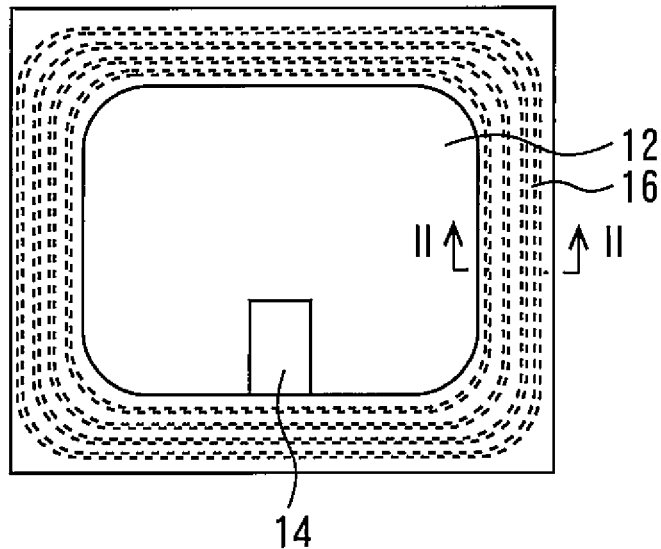
FIG. 1 is a plan view of a semiconductor device in accordance with a first embodiment of the present invention.

FIG. 1 is a plan view of a semiconductor device in accordance with a first embodiment of the present invention. The semiconductor device 10 has a device forming region provided in the central portion of its chip, and an emitter electrode 12 and a gate electrode pad 14 are formed on the surface of the device forming region. An electric field reducing region is provided so as to surround the device forming region, that is, provided along the periphery of the chip, and the surface of the electric field reducing region is covered by a passivation film 16.

Figure 2:
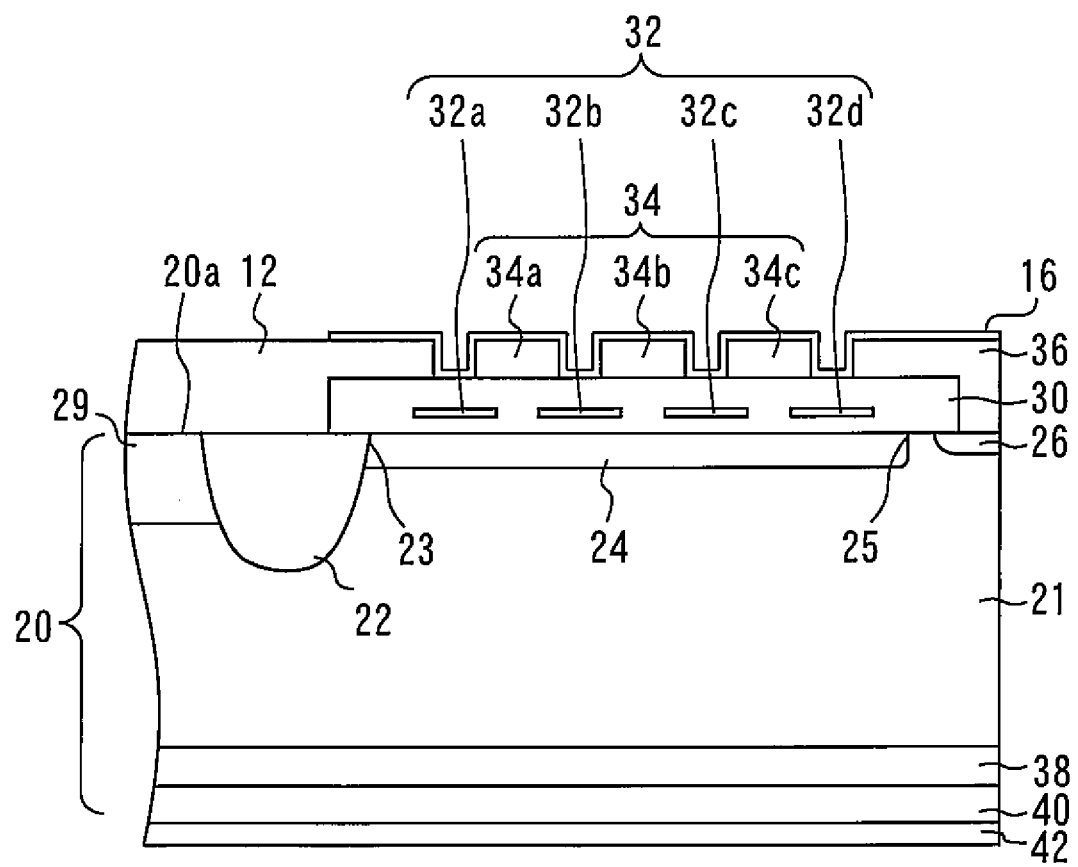
FIG. 2 is a cross-sectional view taken along line II-II of FIG. 1, and primarily shows the electric field reducing region.

FIG. 2 is a cross-sectional view taken along line II-II of FIG. 1, and primarily shows the electric field reducing region. The semiconductor device 10 includes a semiconductor substrate 20. The semiconductor substrate 20 is formed of Si. An n-type first impurity region 21 (hereinafter referred to as the n-type region 21) is formed in the semiconductor substrate 20. Further, a p-type RESURF (or reduced surface field) layer 24 is formed in the semiconductor substrate 20 along its principal surface 20a. The impurity concentration and the depth (or thickness) of the RESURF layer 24 are such that the RESURF layer 24 satisfies its full depletion condition (or RESURF condition). A p-type well layer 22 is formed in the semiconductor substrate 20 adjacent the RESURF layer 24 and along the principal surface 20a. Further, a p-type base layer (or p-base layer) 29 is formed adjacent the side of the p-type well layer 22 opposite the side facing the RESURF layer 24. The p-well layer 22 has a depth equal to or greater than the depth of the p-base layer 29, and has a function to reduce the electric field intensity at the periphery of the p-base layer 29. Further, the p-base layer 29 has a plurality of MOS (metal oxide semiconductor) structures formed therein so that the p-base layer 29 serves as a region in which channels are formed. A boundary region including the boundary between the p-well layer 22 and the RESURF layer 24 is hereinafter referred to as the first boundary region 23. While not shown, it should be noted that trenches are formed to extend, e.g., from the surface of the semiconductor substrate to the n-type region, and each MOS structure described above has the following: a gate electrode formed by filling one of the trenches with polysilicon, with a gate oxide film interposed between the polysilicon and the sidewalls of the trench; and an $n^+$-emitter layer formed along the sides of the trench and extending a predetermined depth from the substrate surface. Further, the on-off operation of the IGBT is effected by controlling the channels formed by the voltage applied to these gate electrodes.

An n-type channel stopper 26 is formed in the semiconductor substrate 20 along the principal surface 20a. The channel stopper 26 is formed in the edge portions (or periphery) of the semiconductor device 10; that is, the channel stopper 26 is disposed away from the p-well layer 22 and adjacent the RESURF layer 24, with the n-type region 21 between the channel stopper 26 and the RESURF layer 24. A boundary region including a boundary between the RESURF layer 24 and the n-type region 21 is hereinafter referred to as the second boundary region 25. An insulating film 30 is formed on the principal surface 20a and continuously covers the surface of the first boundary region 23 and the surface of the second boundary region 25. The insulating film 30 is a silicon oxide film or the like deposited, e.g., by CVD.

A plurality of lower field plates 32 are formed in the insulating film 30. These lower field plates 32 include lower field plates 32a, 32b, 32c, and 32d. The lower field plates 32a, 32b, 32c, and 32d are formed in such a manner that they do not lie directly above the first boundary region 23 and the second boundary region 25. It should be noted that the plurality of lower field plates 32 are concentric and annular as viewed in plan, and in accordance with the present invention the material of these lower field plates 32 is doped polysilicon.

A plurality of upper field plates 34 are formed on the insulating film 30. These upper field plates 34 include upper field plates 34a, 34b, and 34c. The upper field plates 34a, 34b, and 34c are formed in such a manner that they do not lie directly above the first boundary region 23 and the second boundary region 25. The plurality of upper field plates 34, like the lower field plates 32, are concentric and annular as viewed in plan.

An emitter electrode 12 is formed on the p-well layer 22. The emitter electrode 12 is formed in contact with the p-base layer 29 and the p-well layer 22 and extends over the insulating film 30 directly above the first boundary region 23. That is, the emitter electrode 12 is formed to cover the insulating film 30 directly above the first boundary region 23.

A channel stopper electrode 36 is formed on the channel stopper 26. The channel stopper electrode 36 is formed in contact with the channel stopper 26 and extends over the insulating film 30 directly above the second boundary region 25. That is, the channel stopper electrode 36 is formed to cover the insulating film 30 directly above the second boundary region 25. It should be noted that the upper field plates 34, the emitter electrode 12, and the channel stopper electrode 36 are formed, e.g., of a metal film of aluminum, etc. The upper fieldplates 34, the emitter electrode 12, and the channel stopper electrode 36 which overlie the insulating film 30 partially overlap the lower field plates 32 in the insulating film 30 with the insulating film 30 therebetween, thereby forming the desired capacitances.

A passivation film 16 is formed to cover the electric field reducing region. An n-type buffer layer 38 is formed on the opposite side of the semiconductor substrate 20 from the principal surface 20a and is in contact with the n-type region 21. A p-type collector layer 40 is formed in contact with the buffer layer 38. A collector electrode 42 made of a metal film, etc. is formed in contact with the collector layer 40. The semiconductor device 10 of the first embodiment is provided with the components described above.

Figure 3:
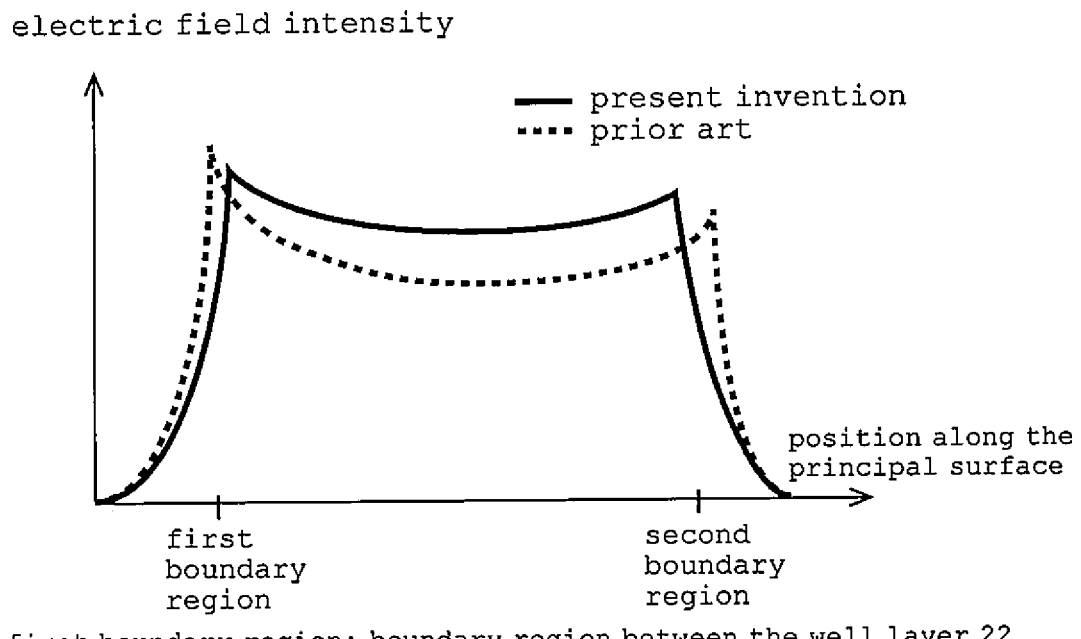
FIG. 3 is a diagram showing the electric field intensity across the surface of the RESURF layer and the adjoining surfaces which extend along the principal surface.

It should be noted that in order to increase the breakdown voltage of the semiconductor device, it is desirable to equalize the electric field intensity across the surface of the RESURF layer and the adjoining surfaces extending along the principal surface of the substrate. It has been found in some cases, however, that the electric field intensity at the first and second boundary regions is too high to increase the breakdown voltage of the semiconductor device. The electric field intensity produced across the surface of the RESURF layer and the adjoining surfaces will be described with reference to FIG. 3. FIG. 3 is a diagram showing the electric field intensity across the surface of the RESURF layer 24 and the adjoining surfaces which extend along the principal surface 20a. Specifically, in FIG. 3, the dashed line indicates the electric field intensity distribution across the RESURF layer and the adjoining surfaces in a conventional semiconductor device in which the lower field plates are disposed in the insulating film directly above the first and second boundary regions. The solid line indicates the electric field intensity distribution across the RESURF layer and the adjoining surfaces in the semiconductor device 10 of the first embodiment.

In the case where the lower field plates are disposed in the insulating film directly above the first and second boundary regions, the electric field intensity is relatively high around and near the edges of the lower field plate closest to the first boundary region (this lower field plate being hereinafter referred to as the first lower field plate) and around and near the edges of the lower field plate closest to the second boundary region (this lower field plate being hereinafter referred to as the second lower field plate). As a result, the electric field intensities at particular portions around the first and second boundary regions are significantly high, and the electric field intensity across the surface of the RESURF layer and the adjoining surfaces is not uniform, as indicated by the dashed line in FIG. 3. In order to overcome this problem, the thickness of the insulating film may be increased to increase the distance between the first lower field plate and the first boundary region and the distance between the second lower field plate and the second boundary region. However, an increase in the thickness of the insulating film results in an increase in the height of steps on the semiconductor substrate which are associated with the insulating film, making it difficult to manufacture the semiconductor device, resulting in increased cost of the deposition of the films of the device.

On the other hand, the configuration of the semiconductor device of the first embodiment makes it possible to prevent any particular portion from being subjected to a high electric field intensity, as well as to substantially equalize the electric field intensity across the surface of the RESURF layer and the adjoining surfaces. Specifically, in the semiconductor device 10 of the first embodiment, the plurality of lower field plates 32 are not formed directly above the first boundary region 23 and the second boundary region 25. This means that the first lower field plate 32a can be spaced an adequate distance from the first boundary region 23 and the second lower field plate 32d can be spaced an adequate distance from the second boundary region 25 so as to reduce the electric field intensities around and near the edges of the first lower field plate 32a and the second lower field plate 32d. Therefore, it is possible to reduce the electric field intensity at the first and second boundary regions and thereby increase the breakdown voltage of the semiconductor device.

Further, in the semiconductor device 10 of the first embodiment, the emitter electrode 12 is formed to extend over the insulating film 30 directly above the first boundary region 23 and overlaps a portion of the lower field plate 32a. This shifts the peak of electric field intensity on the first boundary region side of the electric field reducing region toward the center of the RESURF layer 24 while reducing the electric field intensity. Further, the channel stopper electrode 36 is formed to extend over the insulating film 30 directly above the second boundary region 25 and overlaps a portion of the lower field plate 32d. This shifts the peak of electric field intensity on the second boundary region side of the electric field reducing region toward the center of the RESURF layer 24 while reducing the electric field intensity. Thus the electric field reducing region of the first embodiment has high breakdown voltage-enhancing effect, making it possible to manufacture a reduced size semiconductor device having an adequately high breakdown voltage.

Figure 4:
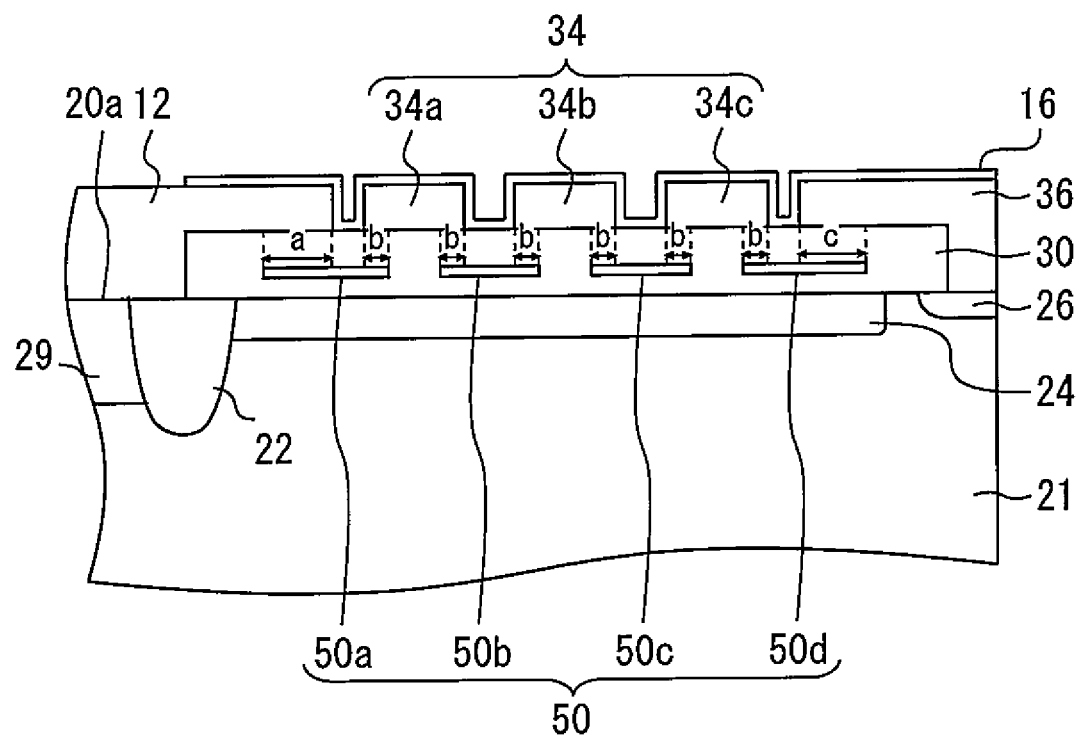
FIG. 4 is a cross-sectional view of a variation of the semiconductor device of the first embodiment.
Figure 5:
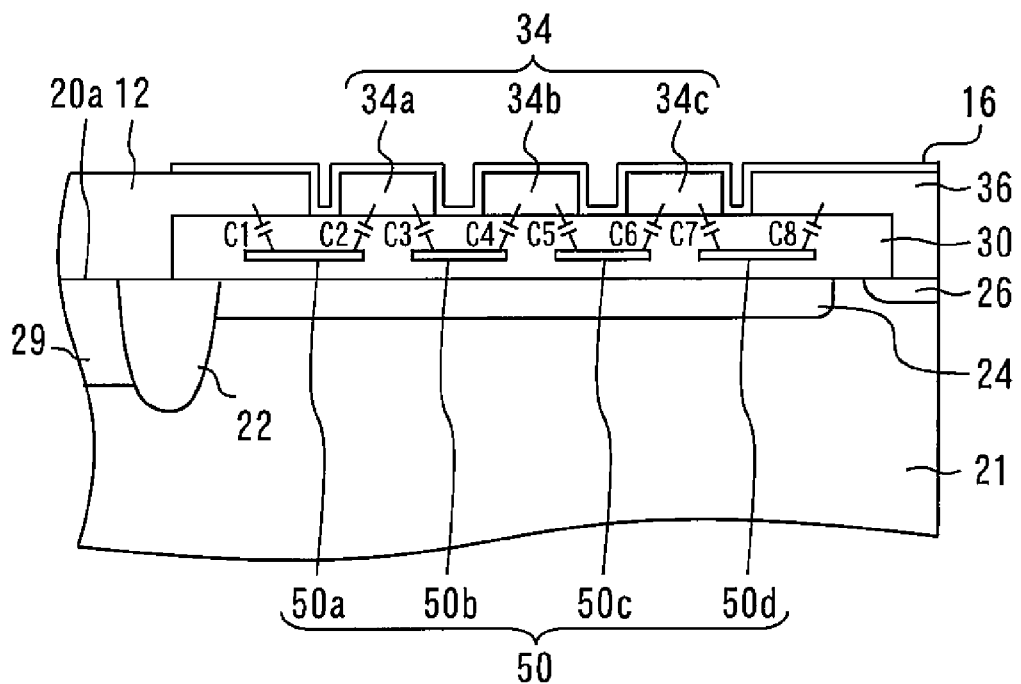
FIG. 5 is a diagram showing the capacitances in the semiconductor device shown in FIG. 4.

FIG. 4 is a cross-sectional view of a variation of the semiconductor device of the first embodiment. This semiconductor device includes a plurality of lower field plates 50, which include lower field plates 50a, 50b, 50c, and 50d. This semiconductor device is characterized by the locations of the first lower field plate 50a and the second lower field plate 50d. The first capacitance formed between the first lower field plate 50a and the emitter electrode 12 and the second capacitance formed between the second lower field plate 50d and the channel stopper electrode 36 are greater than the third capacitance formed between one of the plurality of lower field plates 50 and one of the plurality of upper field plates 34. This magnitude relationship between the capacitances results from the fact that the overlap width a between the first lower field plate 50a and the emitter electrode 12 and the overlap width c between the second lower field plate 50d and the channel stopper electrode 36 are greater than the overlap width b between one of the plurality of upper field plates 34 and one of the plurality of lower field plates 50. FIG. 5 is a diagram showing the capacitances in the semiconductor device shown in FIG. 4. As a result of the overlap width relationship described above, the capacitance C1 between the first lower field plate 50a and the emitter electrode 12 and the capacitance C8 between the second lower field plate 50d and the channel stopper electrode 36 are greater than a capacitance C2, C3, C4, C5, C6, or C7.

In the configuration of this variation, since the capacitances C1 and C8 are large, the potentials of the first lower field plate 50a and the second lower field plate 50d can be reduced to increase the advantages of the semiconductor device 10 described above.

In addition to the above alteration, various other alterations may be made to the semiconductor device of the first embodiment. For example, the present invention does not necessarily require that the emitter electrode 12 be provided directly above the first boundary region 23 and the channel stopper electrode 36 be provided directly above the second boundary region 25.

Second Embodiment

Figure 6:
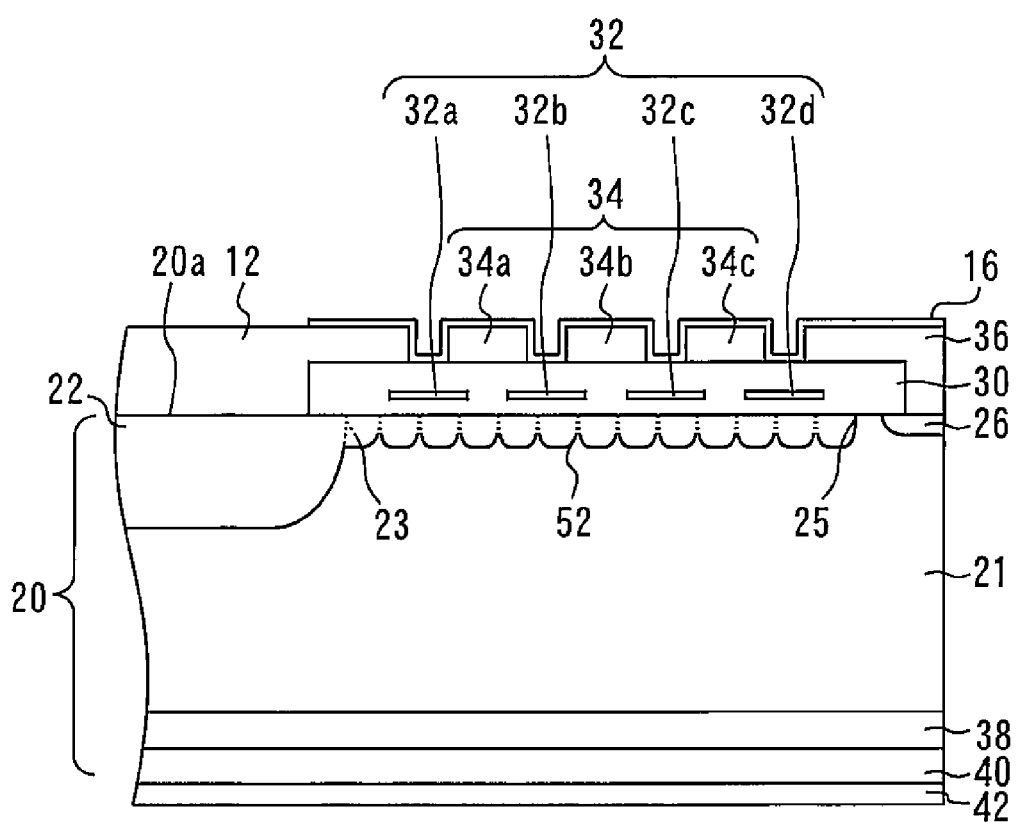
FIG. 6 is a cross-sectional view of a semiconductor device in accordance with a second embodiment of the present invention.

FIG. 6 is a cross-sectional view of a semiconductor device in accordance with a second embodiment of the present invention. The semiconductor device of the second embodiment has many features common to the semiconductor device of the first embodiment. Therefore, the following description of the semiconductor device of the second embodiment will be limited to the differences from the semiconductor device of the first embodiment.

The RESURF layer 52 of the second embodiment is formed by first forming a plurality of p-type regions in the principal surface 20a of the semiconductor substrate 20 and then heat-treating the substrate. As a result of this heat treatment, the plurality of p-type regions together form a single continuous p-type region. The RESURF layer 52 satisfies its full depletion condition (or RESURF condition). The RESURF layer 52 is advantageous in that, being made up of a plurality of p-type regions, it can be formed along with the p-well layer 22 in the same process. This feature is described below.

Figure 7A:
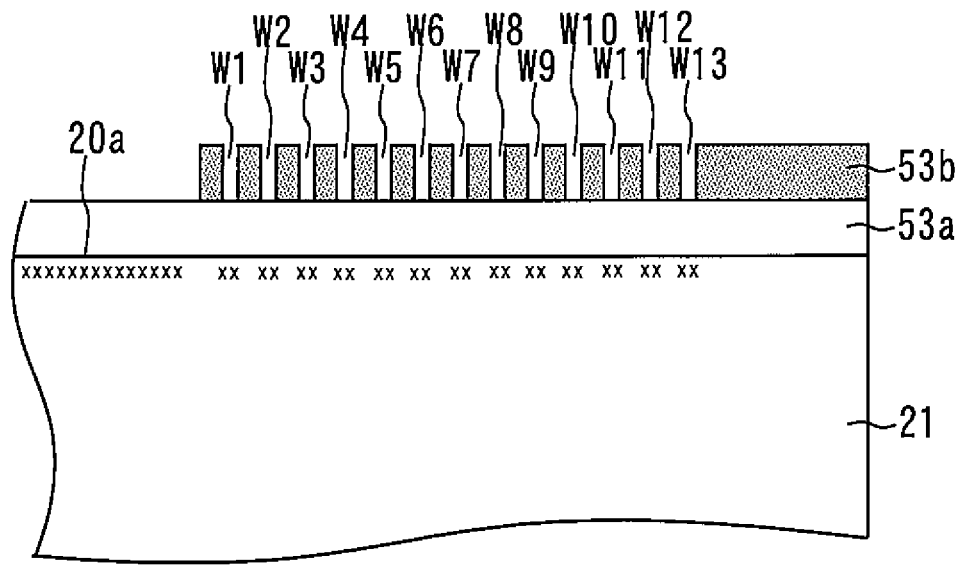
FIG. 7 includes cross-sectional views showing the way in which the p-well layer and the RESURF layer are formed in the same process.
Figure 7B:
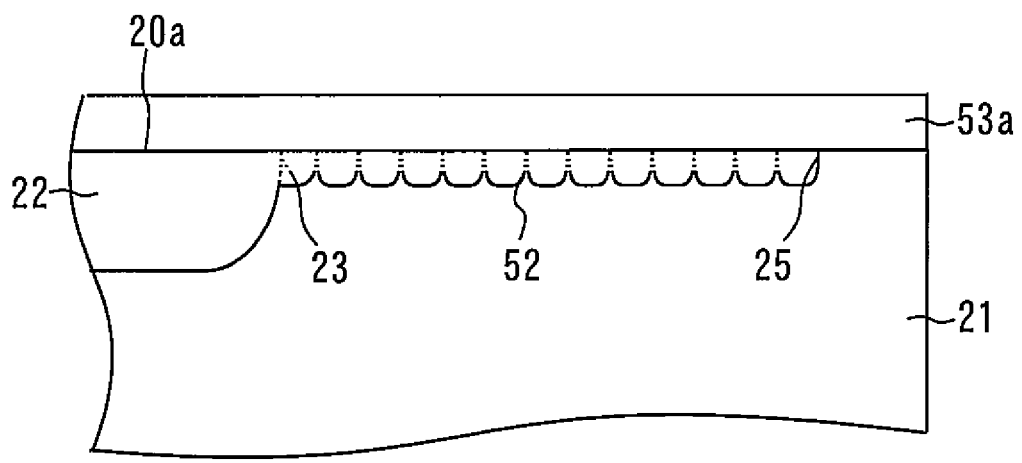

FIG. 7 includes cross-sectional views showing the way in which the p-well layer and the RESURF layer are formed in the same process. Specifically, FIG. 7A shows the electric field reducing region immediately after an ion implantation step, and FIG. 7B shows the electric field reducing region after the ion-implanted impurities have been diffused by subjecting the substrate to heat treatment. In this forming process, first an insulating film 53a is formed on the n-type region 21 by a general semiconductor manufacturing technique, and a resist 53b is formed on the insulating film 53a by a photolithographic technique, etc. The resist 53b has formed therein openings having widths W1 to W13. These widths W1 to W13 are equal. Ions are then implanted using the resist 53b as a mask, thereby forming a plurality of p-type regions in the principal surface 20a of the semiconductor substrate 20. FIG. 7A shows the p-type regions immediately after they have been formed. The resist 53b is then removed, and heat treatment is performed to diffuse the impurities in the plurality of p-type regions and thereby simultaneously form the p-well layer 22 and the RESURF layer 52, as shown in FIG. 7B. The use of this forming method makes it possible to manufacture a reduced size semiconductor device having an adequately high breakdown voltage at low cost.

Third Embodiment

Figure 8:
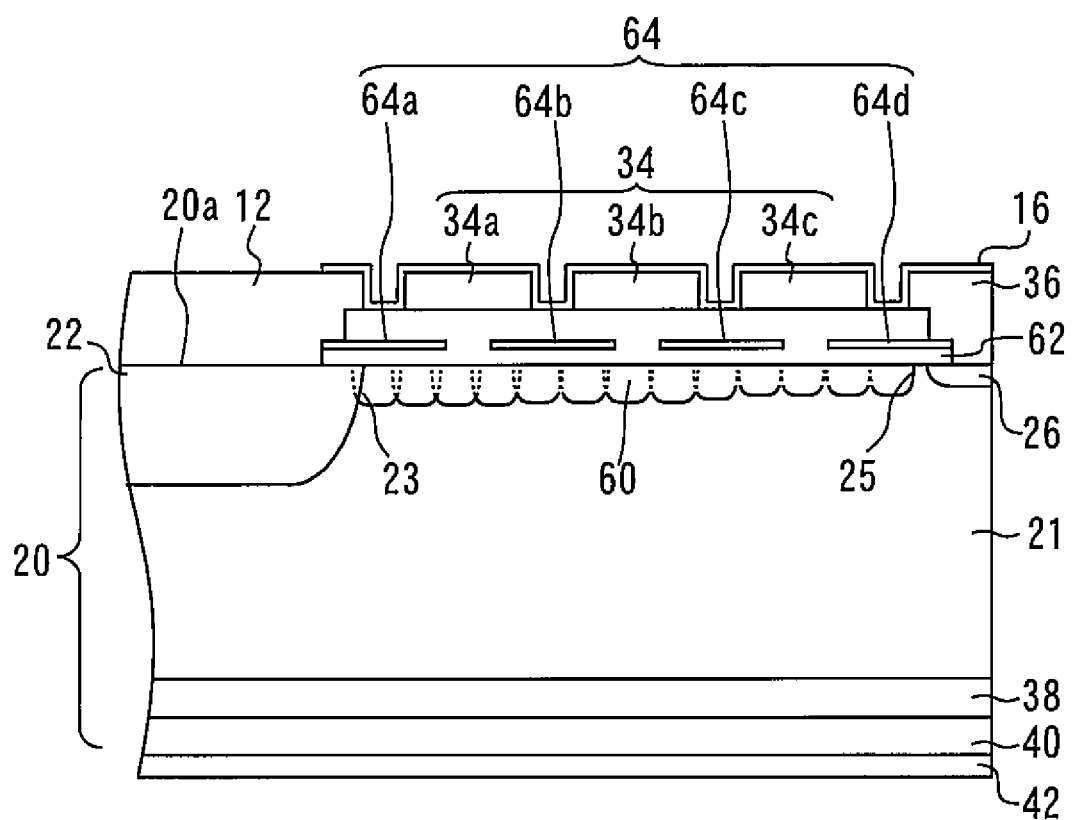
FIG. 8 is a cross-sectional view of a semiconductor device in accordance with a third embodiment of the present invention.

FIG. 8 is a cross-sectional view of a semiconductor device in accordance with a third embodiment of the present invention. The semiconductor device of the third embodiment has many features common to the semiconductor device of the first embodiment. Therefore, the following description of the semiconductor device of the third embodiment will be limited to the differences from the semiconductor device of the first embodiment.

The RESURF layer 60 of the third embodiment is formed by first forming a plurality of p-type regions in the principal surface 20a of the semiconductor substrate 20 in such a manner that they are closely spaced on the p-well layer 22 side of the electric field reducing region and widely spaced on the channel stopper 26 side of the electric field reducing region, and then heat-treating the substrate. After the heat treatment, the impurity concentration in the RESURF layer 60 is high on the p-well layer 22 side, on which the p-type regions are closely spaced, and low on the channel stopper 26 side, on which the p-type regions are widely spaced. The RESURF layer 60 is formed so as to satisfy its full depletion condition (or RESURF condition).

An insulating film 62 is formed on the principal surface 20a and covers the first boundary region 23 and the second boundary region 25. A plurality of lower field plates 64 are formed in the insulating film 62. These lower field plates 64 include lower field plates 64a, 64b, 64c, and 64d. The lower field plate 64a is connected to the emitter electrode 12. The lower field plate 64d is connected to the channel stopper electrode 36.

Figure 9A:
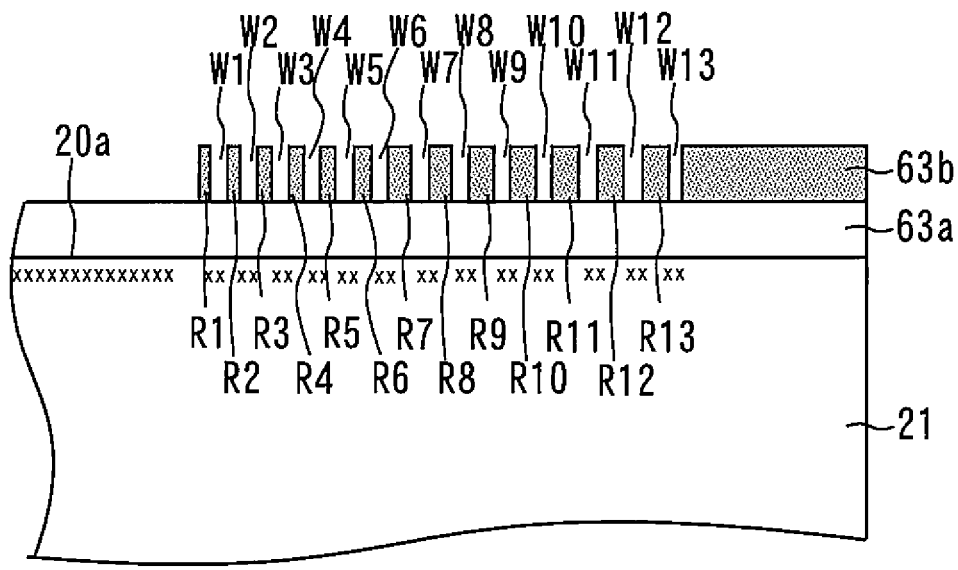
FIG. 9 includes cross-sectional views showing the method of forming the RESURF layer in accordance with the third embodiment.
Figure 9B:
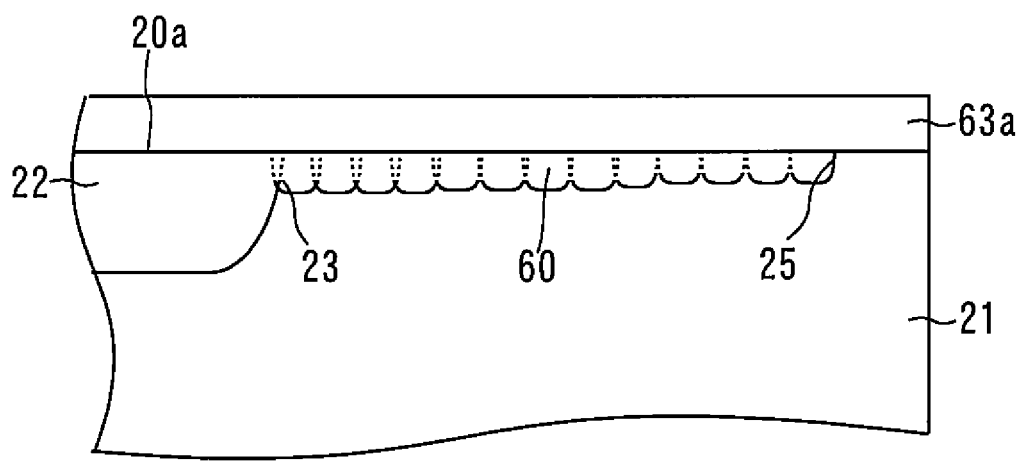

A method of forming the RESURF layer 60 will now be specifically described. FIG. 9 includes cross-sectional views showing the method of forming the RESURF layer in accordance with the third embodiment, wherein FIG. 9A shows the electric field reducing region immediately after an ion implantation step and FIG. 9B shows the electric field reducing region after the ion-implanted impurities have been diffused by subjecting the substrate to heat treatment. The method begins by forming an insulating film 63a on the n-type region 21. A resist 63b is then formed on the insulating film 63a. The resist 63b includes resist portions R1 to R13 and openings defined by these resist portions. The openings have widths W1 to W13, which are equal. The widths of the resist R1 to R13 satisfy the following relation: width of R1<width of R2<width of R3<width of R4<width of R5<width of R6<width of R7<width of R8<width of R9<width of R10<width of R11<width of R12<width of R13. Ions are then implanted using the resist 63b as a mask, thereby forming a plurality of p-type regions in the principal surface 20a of the semiconductor substrate 20. FIG. 9A shows the p-type regions immediately after they have been formed. The resist 63b is then removed, and heat treatment is performed to diffuse the impurities in the plurality of p-type regions and thereby simultaneously form the p-well layer 22 and the RESURF layer 60, as shown in FIG. 9B.

In the semiconductor device of the third embodiment, since the impurity concentration is high on the emitter side of the RESURF layer 60, that side of the RESURF layer 60 is unlikely to be depleted (that is, the depletion layer is unlikely to fully extend through the emitter side). As a result, the equipotential lines in the boundary, or the first boundary region, between the p-well layer 22 and the RESURF layer 60 are relatively widely spaced, making it possible to reduce the electric field intensity at the first boundary region. On the other hand, since the impurity concentration is low on the channel stopper side of the RESURF layer 60, the channel stopper side of the RESURF layer 60 is likely to be depleted, making it possible to reduce the electric field intensity on that side of the RESURF layer 60. In this way the electric field intensity across the surface of the RESURF layer 60 (i.e., across the principal surface 20a) can be substantially equalized to increase the breakdown voltage of the semiconductor device. Therefore, in accordance with the configuration of the semiconductor device of the third embodiment, it is possible to manufacture a reduced size semiconductor device having an adequately high breakdown voltage. Further, since the p-well layer 22 and the RESURF layer 60 can be simultaneously formed, the above-described advantages of the third embodiment can be achieved at low cost.

The semiconductor device of the third embodiment is characterized in that the peaks of the electric field intensity across the surface of the RESURF layer 60 and the adjoining surfaces are reduced by adjusting the impurity concentration in the RESURF layer 60 so that the impurity concentration is high on the emitter side of the RESURF layer 60 and low on the channel stopper side. Therefore, the plurality of lower field plates 64 and the plurality of upper field plates 34 may be omitted from the semiconductor device.

Fourth Embodiment

Figure 10:
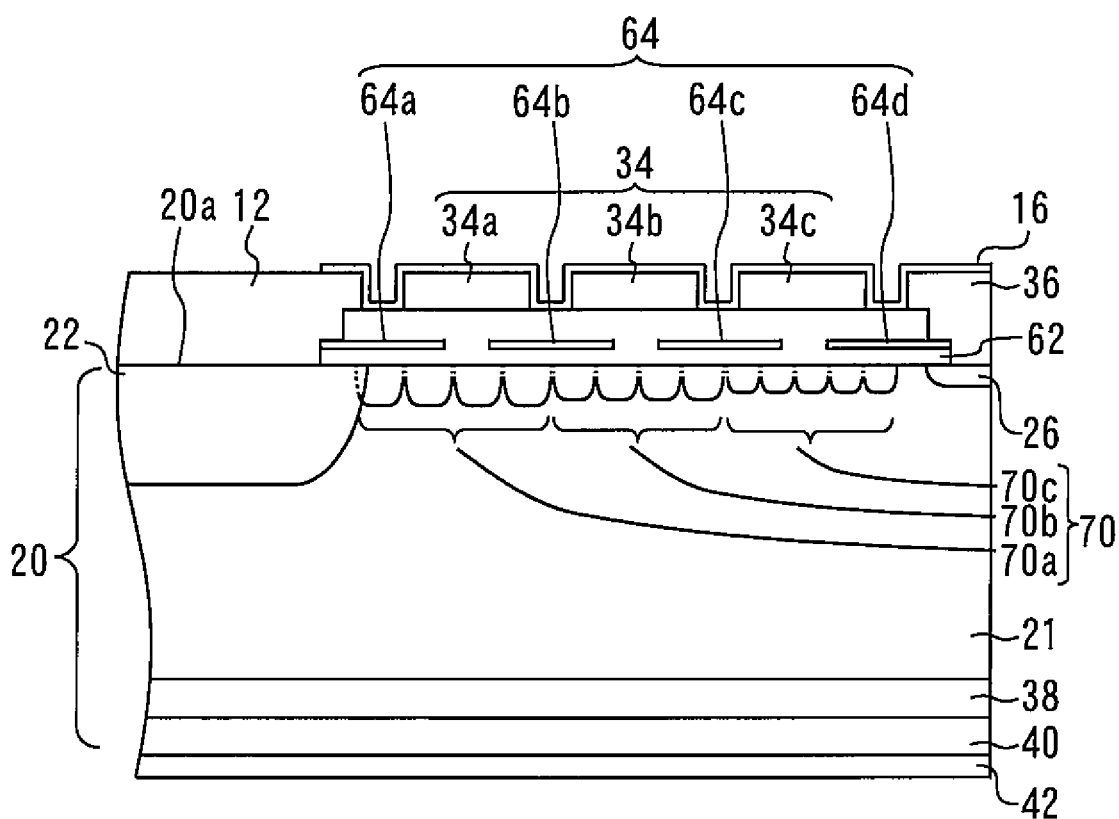
FIG. 10 is a cross-sectional view of a semiconductor device in accordance with a fourth embodiment of the present invention.

FIG. 10 is a cross-sectional view of a semiconductor device in accordance with a fourth embodiment of the present invention. The semiconductor device of the fourth embodiment has many features common to the semiconductor device of the third embodiment. Therefore, the following description of the semiconductor device of the fourth embodiment will be limited to the differences from the semiconductor device of the third embodiment.

The RESURF layer 70 of the fourth embodiment is formed by first forming a plurality of p-type regions in the principal surface 20a of the semiconductor substrate 20 in such a manner that their surface areas gradually decrease as the regions are located further away from the p-well layer 22 toward the channel stopper 26, and then heat-treating the substrate. Specifically, the RESURF layer 70 includes a first region 70a in contact with the p-well layer, a second region 70b in contact with the first region 70a, and a third region 70c in contact with the second region 70b. Each of the first region 70a, the second region 70b, and the third region 70c includes a plurality of p-type layers having equal surface areas.

However, the surface area of the p-type layers of the second region 70b is smaller than that of the p-type layers of the first region 70a. Further, the surface area of the p-type layers of the third region 70c is smaller than that of the p-type layers of the second region 70b. The depth of the p-type layers of the second region 70b from the principal surface 20a is less than that of the p-type layers of the first region 70a. The depth of the p-type layers of the third region 70c from the principal surface 20a is less than that of the p-type layers of the second region 70b. The p-type impurity concentrations of the p-type layers of the first region 70a, the second region 70b, and the third region 70c increase in the order named.

Figure 11A:
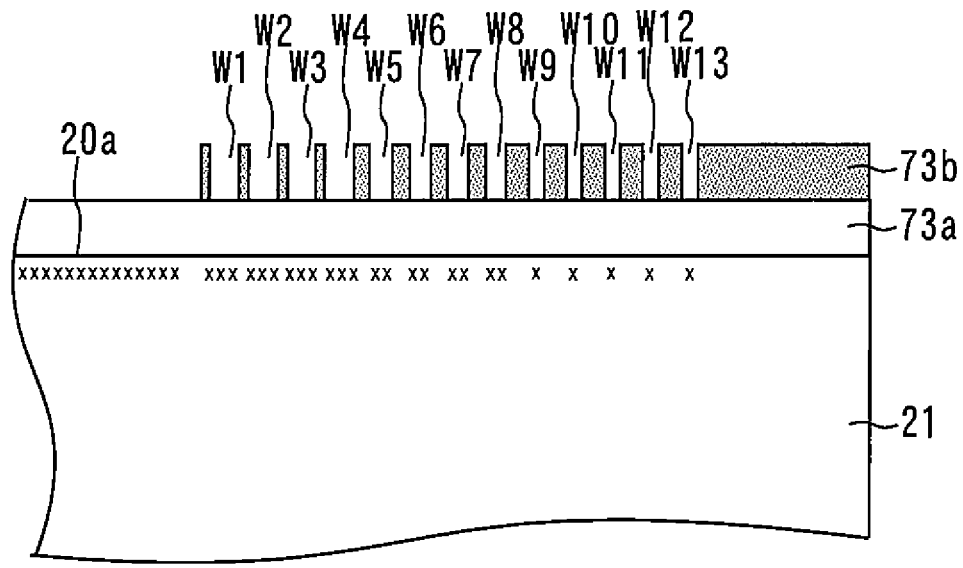
FIG. 11 includes cross-sectional views showing the method of forming the RESURF layer in accordance with the fourth embodiment of the present invention.
Figure 11B:
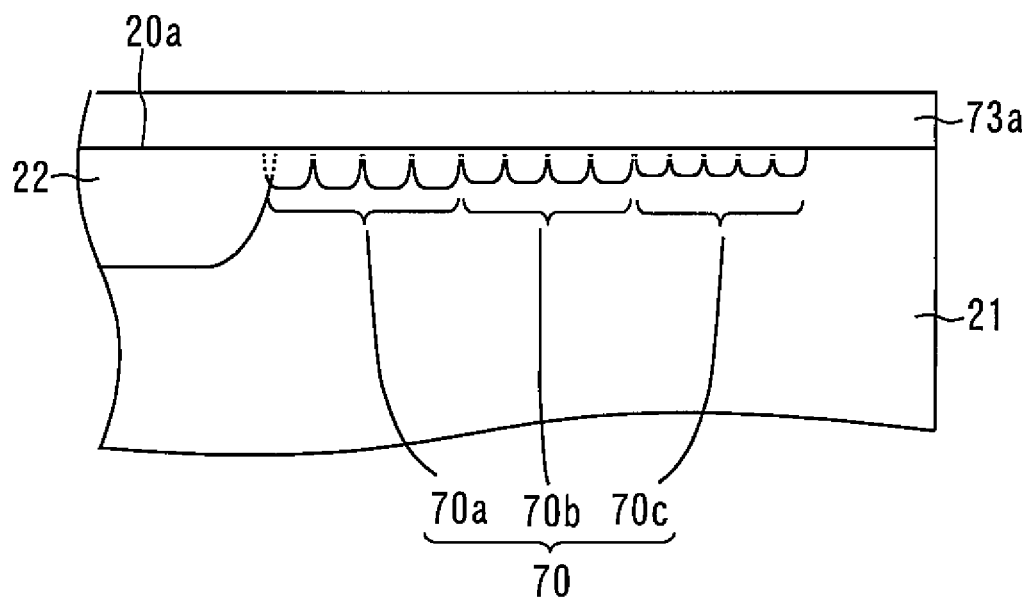

A method of forming the RESURF layer 70 will now be described. FIG. 11 includes cross-sectional views showing the method of forming the RESURF layer in accordance with the fourth embodiment, wherein FIG. 11A shows the electric field reducing region immediately after an ion implantation step and FIG. 11B shows the electric field reducing region after the ion-implanted impurities have been diffused by subjecting the substrate to heat treatment. The method begins by forming an insulating film 73a on the n-type region 21. A resist 73b is then formed on the insulating film 73a. The resist 73b has openings having widths W1 to W13. The widths W1 to W4 are equal, the widths W5 to W8 are equal, and the widths W9 to W13 are equal, where W1>W5>W9. Ions are then implanted using the resist 73b as a mask. Then, the resist 73b is removed, and heat treatment is performed to simultaneously form the p-well layer 22 and the RESURF layer 70.

The semiconductor device of the fourth embodiment has the same advantages as the semiconductor device of the third embodiment. The semiconductor device of the fourth embodiment differs from that of the third embodiment in that the impurity concentration gradient in the RESURF layer is produced by use of a resist having openings of different widths. It should be noted that the plurality of lower field plates 64 and the plurality of upper field plates 34 may be omitted from the semiconductor device of the fourth embodiment, as is the case with the semiconductor device of the third embodiment.

Fifth Embodiment

Figure 12:
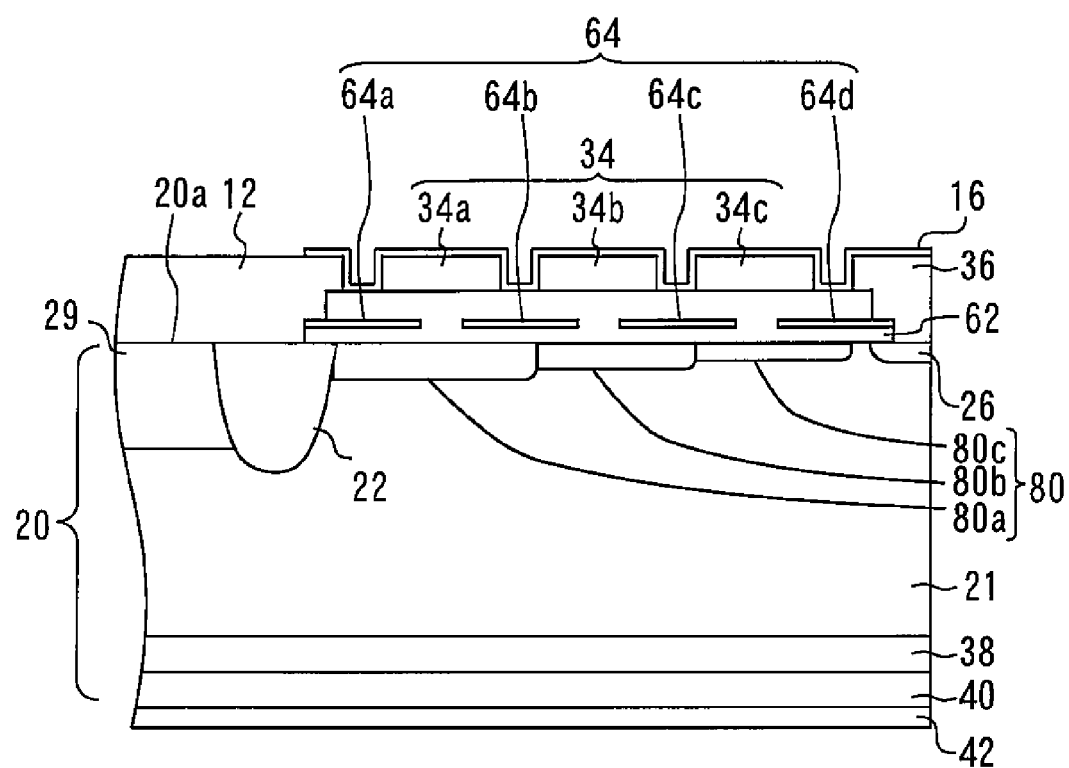
FIG. 12 is a cross-sectional view of a semiconductor device in accordance with a fifth embodiment of the present invention.

FIG. 12 is a cross-sectional view of a semiconductor device in accordance with a fifth embodiment of the present invention. The semiconductor device of the fifth embodiment has many features common to the semiconductor device of the third embodiment. Therefore, the following description of the semiconductor device of the fifth embodiment will be limited to the differences from the semiconductor device of the third embodiment.

The RESURF layer 80 of the fifth embodiment includes a first region 80a, a second region 80b, and a third region 80c. The p-type impurity concentrations of the first region 80a, the second region 80b, and the third region 80c increase in the order named. A method of forming the RESURF layer 80 is to perform impurity introduction and heat treatment for forming the first region 80a, then those for forming the second region 80b, and then those for forming the third region 80c. However, these impurity introduction steps are not limited to this particular order. Further, heat treatment may be performed only after the completion of all the impurity introduction steps, instead of performing heat treatment after the completion of each impurity introduction step.

The semiconductor device of the fifth embodiment has the same advantages as the semiconductor devices of the third and fourth embodiments. Furthermore, the fifth embodiment allows the RESURF layer to be formed while accurately controlling its impurity concentration, as compared with the third and fourth embodiments, making it possible to manufacture semiconductor devices which vary little in characteristics. Although in the third, fourth, and fifth embodiments the RESURF layer has an impurity concentration gradient in the lateral direction (parallel to the principal surface 20a), the present invention is not limited to this particular impurity concentration profile of the RESURF layer. The only requirement for the impurity concentration of the RESURF layer is that the p-type impurity concentration of the RESURF layer gradually decreases away from the p-well layer toward the channel stopper layer.

Sixth Embodiment

Figure 13:
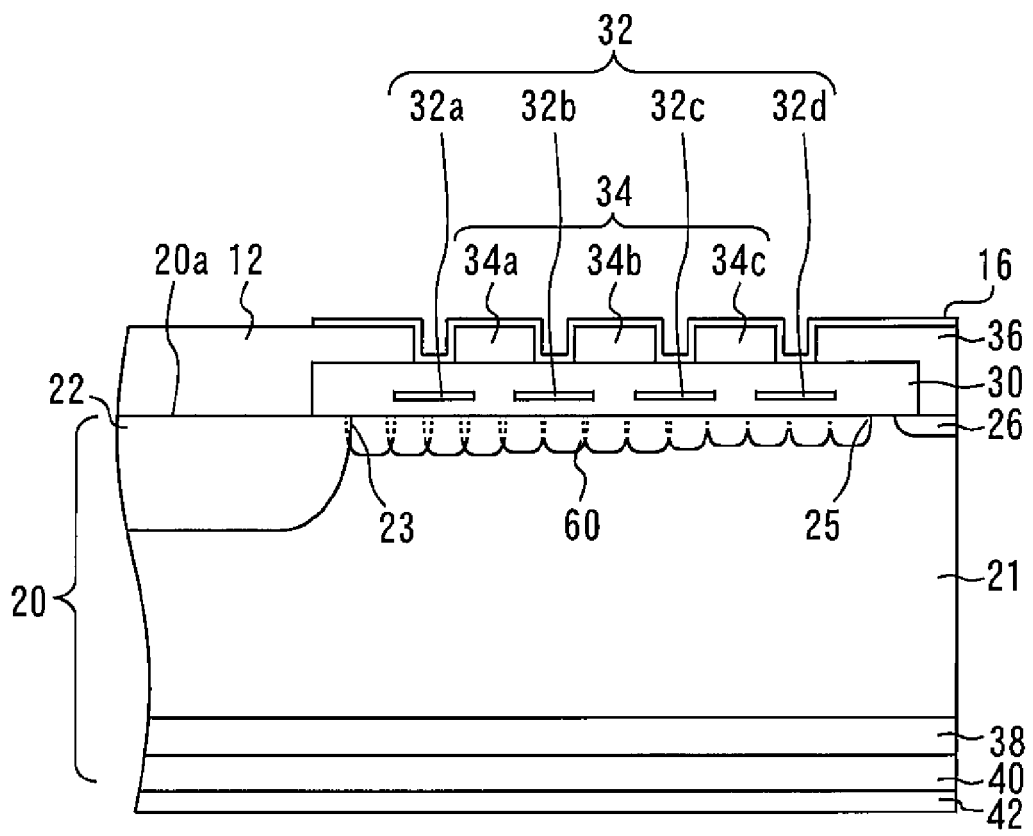
FIG. 13 is a cross-sectional view of a semiconductor device in accordance with a sixth embodiment of the present invention.

FIG. 13 is a cross-sectional view of a semiconductor device in accordance with a sixth embodiment of the present invention. In the semiconductor device of the sixth embodiment, the structure on the semiconductor substrate 20 is identical to that in the semiconductor device of the first embodiment, and the RESURF layer is identical to that of the semiconductor device of the third embodiment.

Figure 14:
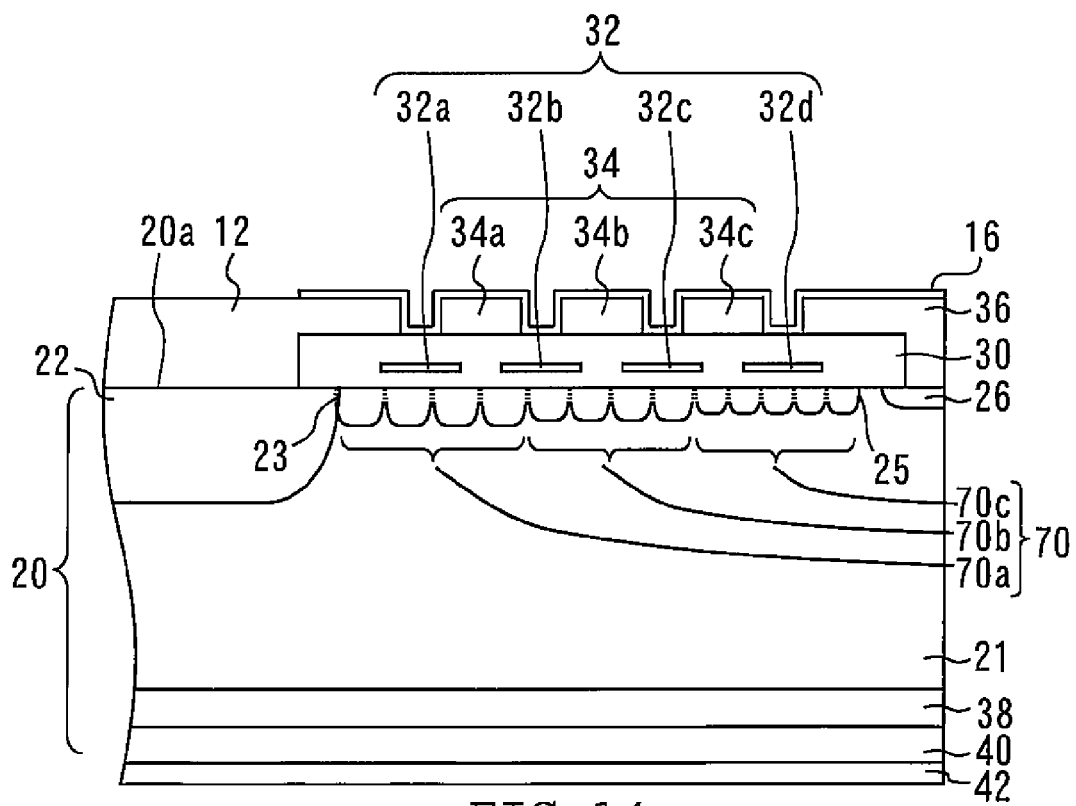
FIG. 14 is a cross-sectional view of a semiconductor device having the RESURF layer shown in FIG. 10 described in connection with the fourth embodiment.
Figure 15:
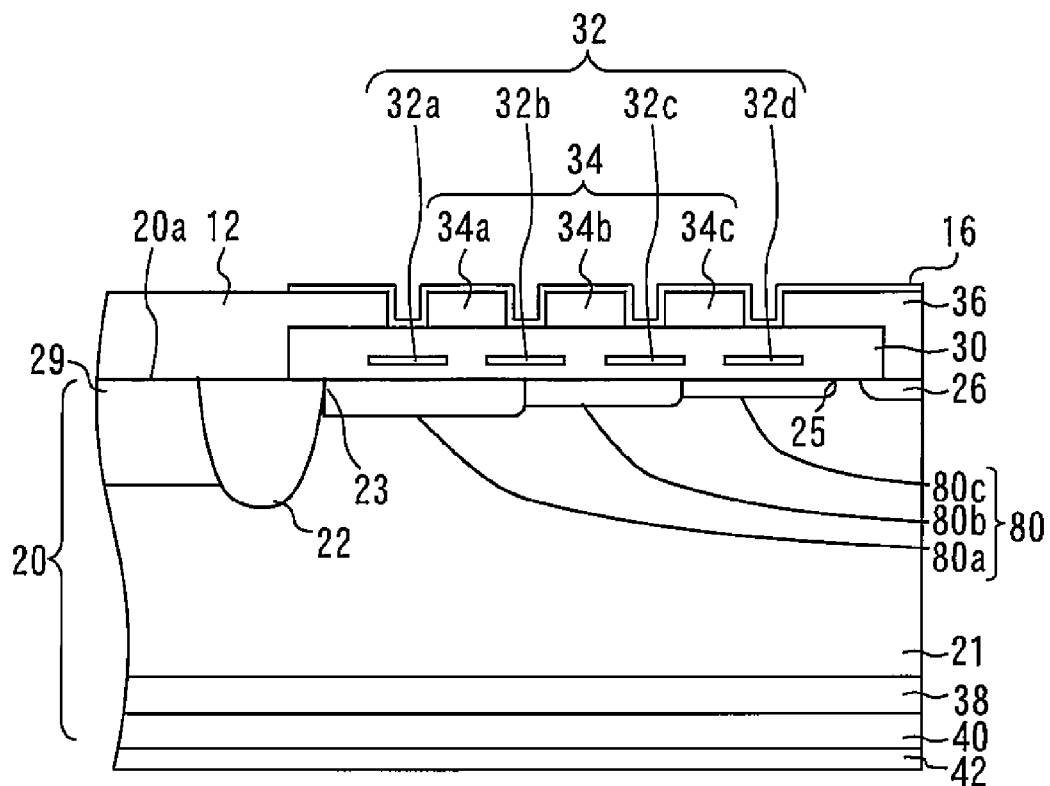
FIG. 15 is a cross-sectional view of a semiconductor device having the RESURF layer shown in FIG. 12 described in connection with the fifth embodiment.

The semiconductor device of the sixth embodiment has an increased breakdown voltage. It should be noted that the electric field reducing region has breakdown voltage enhancing effect as long as the RESURF layer 60 is formed to have a p-type impurity concentration which gradually decreases away from the p-well layer 22 toward the channel stopper 26. FIGS. 14 and 15 show variations of the semiconductor device of the sixth embodiment which have a RESURF layer different from that of the sixth embodiment. Specifically, FIG. 14 is a cross-sectional view of a semiconductor device having the RESURF layer 70 shown in FIG. 10 described in connection with the fourth embodiment. FIG. 15 is a cross-sectional view of a semiconductor device having the RESURF layer 80 shown in FIG. 12 described in connection with the fifth embodiment.

Seventh Embodiment

Figure 16:
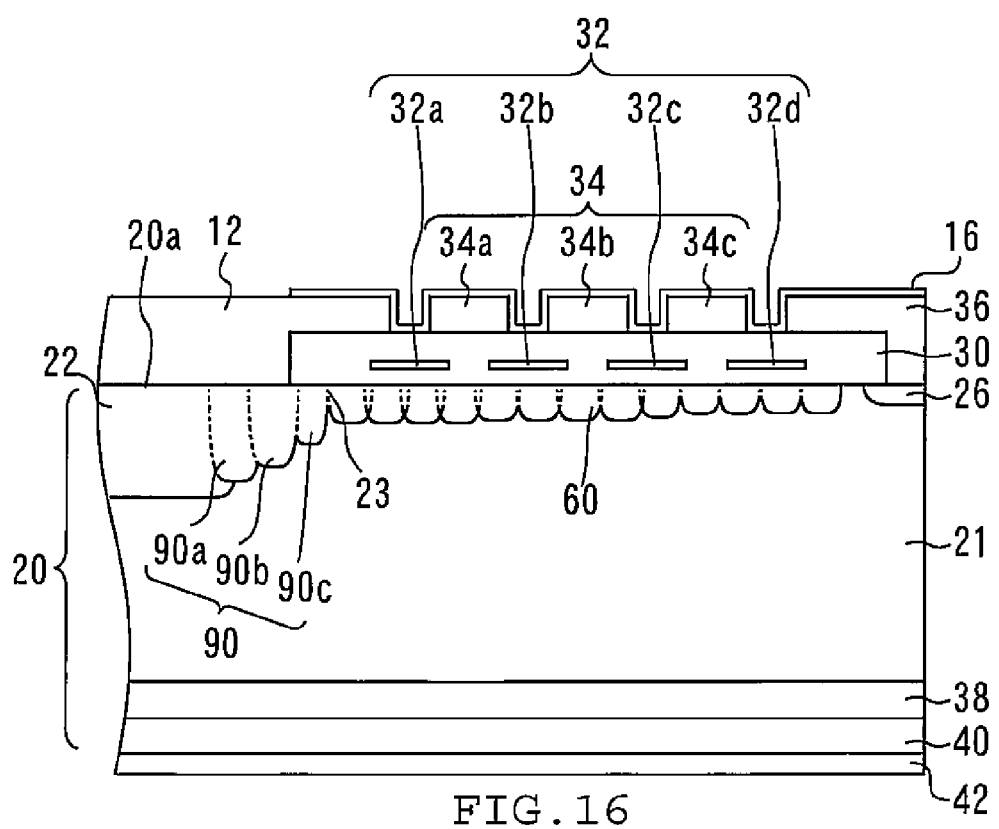
FIG. 16 is a cross-sectional view of a semiconductor device in accordance with a seventh embodiment of the present invention.

FIG. 16 is a cross-sectional view of a semiconductor device in accordance with a seventh embodiment of the present invention. The semiconductor device of the seventh embodiment has many features common to the semiconductor device of the sixth embodiment shown in FIG. 13. Therefore, the following description of the semiconductor device of the seventh embodiment will be limited to the differences from the semiconductor device of the sixth embodiment.

A concentration gradient reducing section 90 is formed in the portion of the p-well layer 22 adjacent the RESURF layer 60. The p-type impurity concentration of the concentration gradient reducing section 90, which constitutes a portion of the p-well layer 22, is such that the p-type impurity concentration gradient between the p-well layer 22 and the RESURF layer 60 is reduced. The concentration gradient reducing section 90 includes p-type regions 90a, 90b, and 90c. It should be noted that the p-well layer 22, which includes the concentration gradient reducing section 90, and the RESURF layer 60 are formed in the same process.

In the semiconductor device of the seventh embodiment, the concentration gradient reducing section 90 serves to reduce the impurity concentration gradient in the lateral direction (parallel to the principal surface 20a). Since the p-well layer 22 includes the concentration gradient reducing section 90, the curved surface of the p-well layer 22 has a relatively large curvature radius (as compared with the embodiments described above), making it possible to reduce the electric field at that surface and increase the breakdown voltage of the semiconductor device. It should be noted that the impurity concentration in some region of the surface of the concentration gradient reducing section 90 may have a suitable gradient (e.g., a Gaussian gradient) so as to produce the effect described above.

Figure 17:
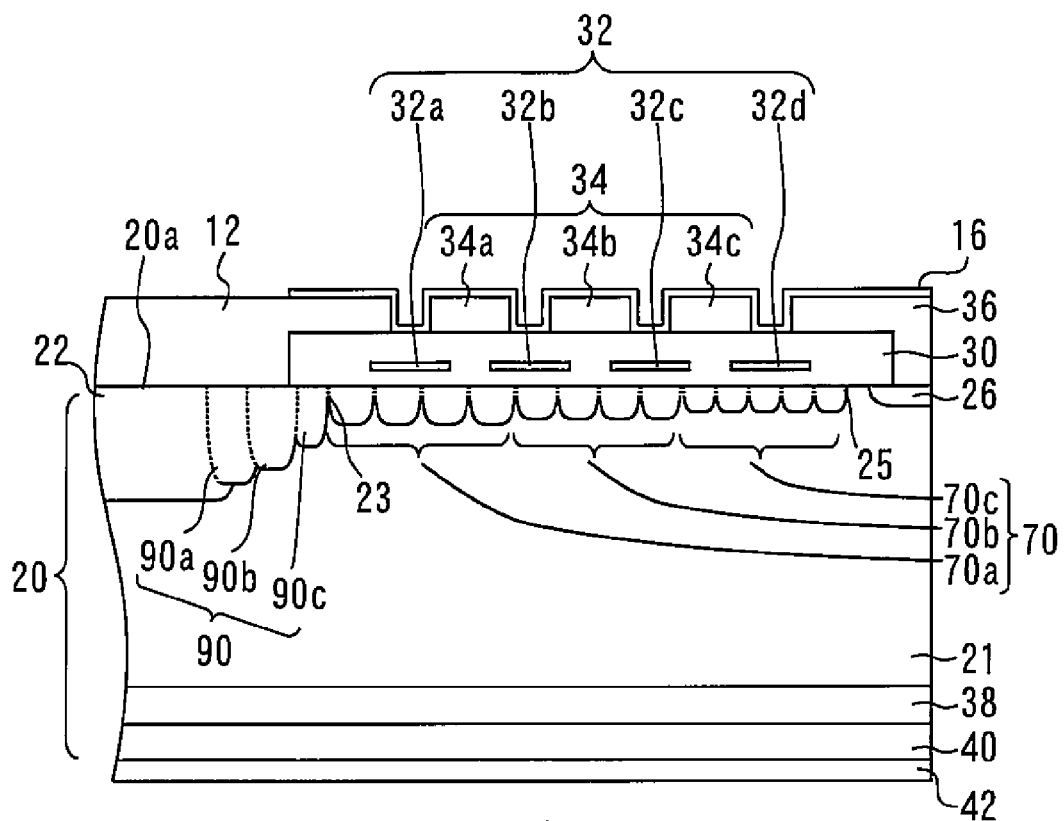
FIG. 17 is a cross-sectional view of a semiconductor device having the RESURF layer shown in FIG. 10 described in connection with the fourth embodiment.
Figure 18:
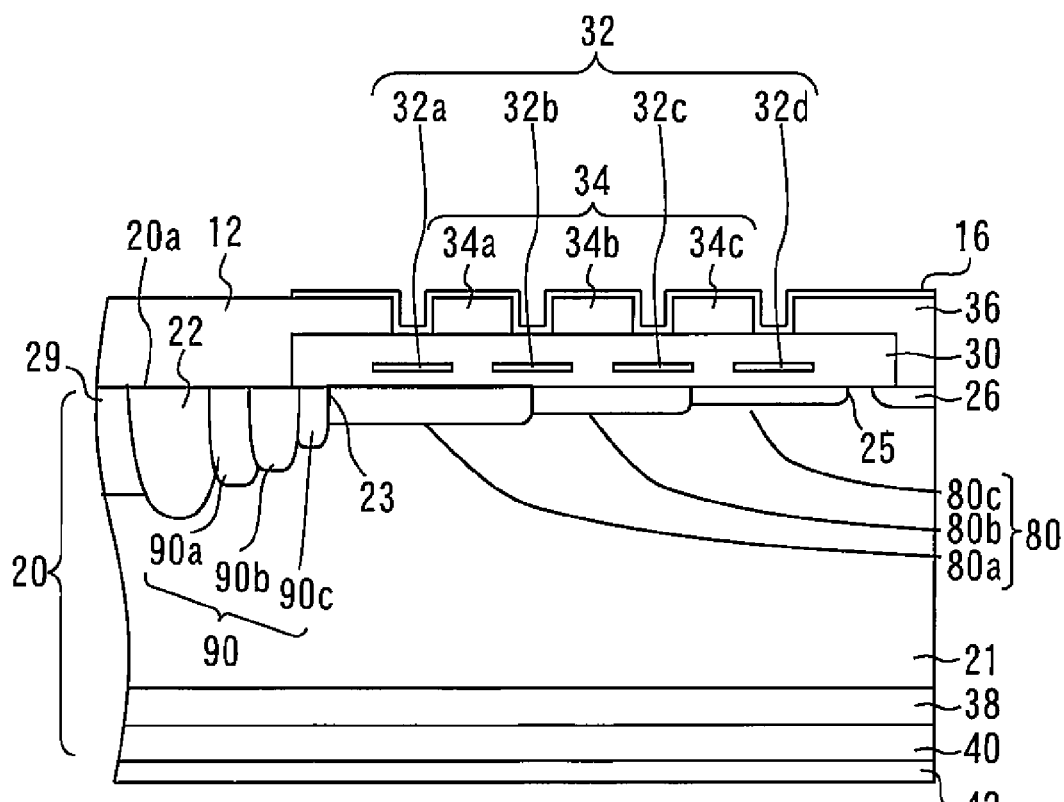
FIG. 18 is a cross-sectional view of a semiconductor device having the RESURF layer shown in FIG. 12 described in connection with the fifth embodiment.

The semiconductor device of the seventh embodiment is characterized by being provided with the concentration gradient reducing section 90 for reducing the electric field at the curved surface of the p-well layer 22. A variety of alterations can be made to this semiconductor device as long as this feature is retained. For example, FIGS. 17 and 18 show semiconductor devices which are similar to that of the seventh embodiment, but have a different RESURF layer. Specifically, FIG. 17 is a cross-sectional view of a semiconductor device having the RESURF layer 70 shown in FIG. 10 described in connection with the fourth embodiment. FIG. 18 is a cross-sectional view of a semiconductor device having the RESURF layer 80 shown in FIG. 12 described in connection with the fifth embodiment.

Eighth Embodiment

Figure 19:
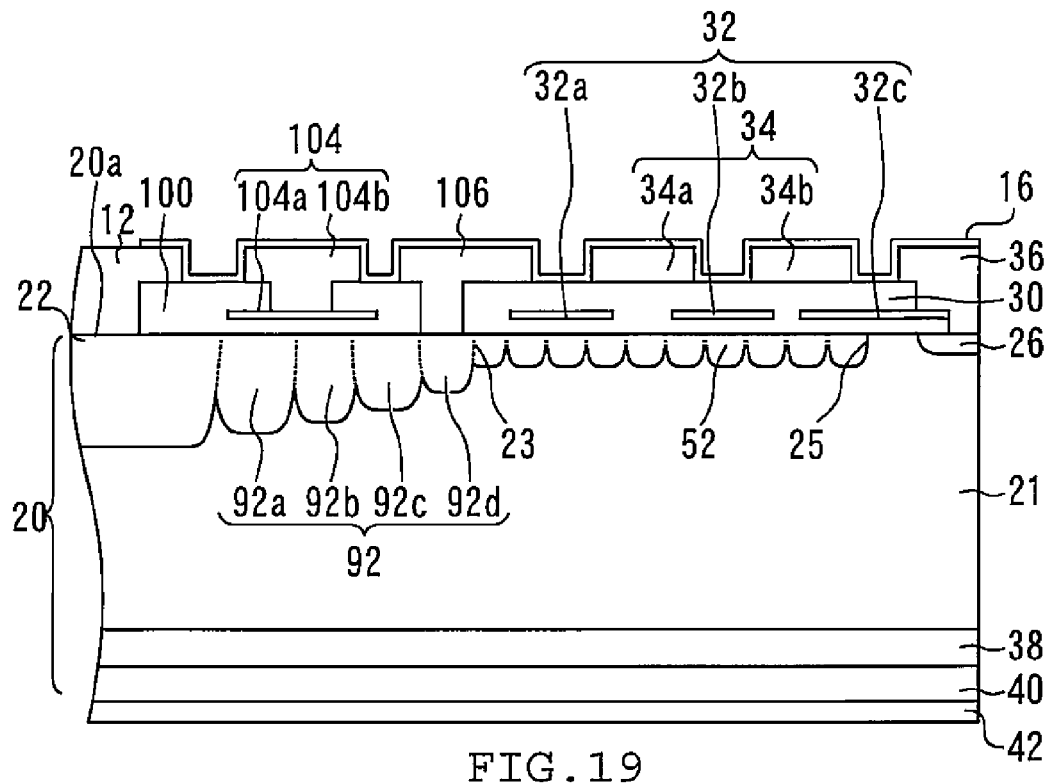
FIG. 19 is a cross-sectional view of a semiconductor device in accordance with an eighth embodiment of the present invention.

FIG. 19 is a cross-sectional view of a semiconductor device in accordance with an eighth embodiment of the present invention. The semiconductor device of the eighth embodiment has many features common to the semiconductor device of the second embodiment shown in FIG. 6. Therefore, the following description of the semiconductor device of the eighth embodiment will be limited to the differences from the semiconductor device of the second embodiment.

A concentration gradient reducing section 92 is formed in the portion of the p-well layer 22 adjacent the RESURF layer 52. The p-type impurity concentration of the concentration gradient reducing section 92, which constitutes a portion of the p-well layer 22, is such that the p-type impurity concentration gradient between the p-well layer 22 and the RESURF layer 52 is reduced. The concentration gradient educing section 92 includes p-type regions 92a, 92b, 92c, and 92d. An insulating film 100 is formed on the concentration gradient reducing section 92. A gate wire 104 is formed on the insulating film 100 directly above the p-type regions 92a, 92b, and 92c, which are on the opposite side of the concentration gradient reducing section 92 from the RESURF layer 52. The gate wire 104 includes polysilicon 104a and aluminum 104b.

Further, an emitter grounding electrode 106 is formed directly above the p-type region 92d, which is on the side of the concentration gradient reducing section 92 adjacent the RESURF layer 52. The emitter grounding electrode 106 is connected to the emitter electrode 12 so that they are at the same potential. The emitter grounding electrode 106 is in contact with the concentration gradient reducing section 92 of the p-well layer 22 and extends over the insulating film 30 directly above the first boundary region 23. The plurality of lower field plates 32 are formed in such a manner that they do not lie directly above the first boundary region 23. Since, as described above, the emitter grounding electrode 106 is formed on the insulating film 30 directly above the first boundary region 23, the electric field intensity at the first boundary region 23 can be reduced in the manner described above in connection with the first embodiment.

It should be noted that in order to stabilize the potential of a gate wire, it is common to form a p-well layer or an extension region thereof under the gate wire. The portion or extension of a p-well layer formed to stabilize the potential of a gate wire is hereinafter referred to as a "p-well layer extension portion." A p-well layer extension portion formed in a semiconductor device takes some space, which has prevented miniaturization of semiconductor devices. In the semiconductor device of the eighth embodiment, however, the gate wire 104 is formed directly above the concentration gradient reducing section 92, eliminating the need to form a p-well layer extension portion. This makes it possible to manufacture semiconductor devices of reduced size.

Furthermore, since the lateral electric field (electric field parallel to the principal surface 20a) is reduced by the RESURF layer, there is no lateral potential difference across the concentration gradient reducing section 92, making it possible to stabilize the potential of the gate wire 104. Thus, the concentration gradient reducing section 92 of the eighth embodiment functions as a p-well layer extension portion, as well as serving to reduce the electric field at the curved surface of the p-well layer 22, as described above.

Figure 20:
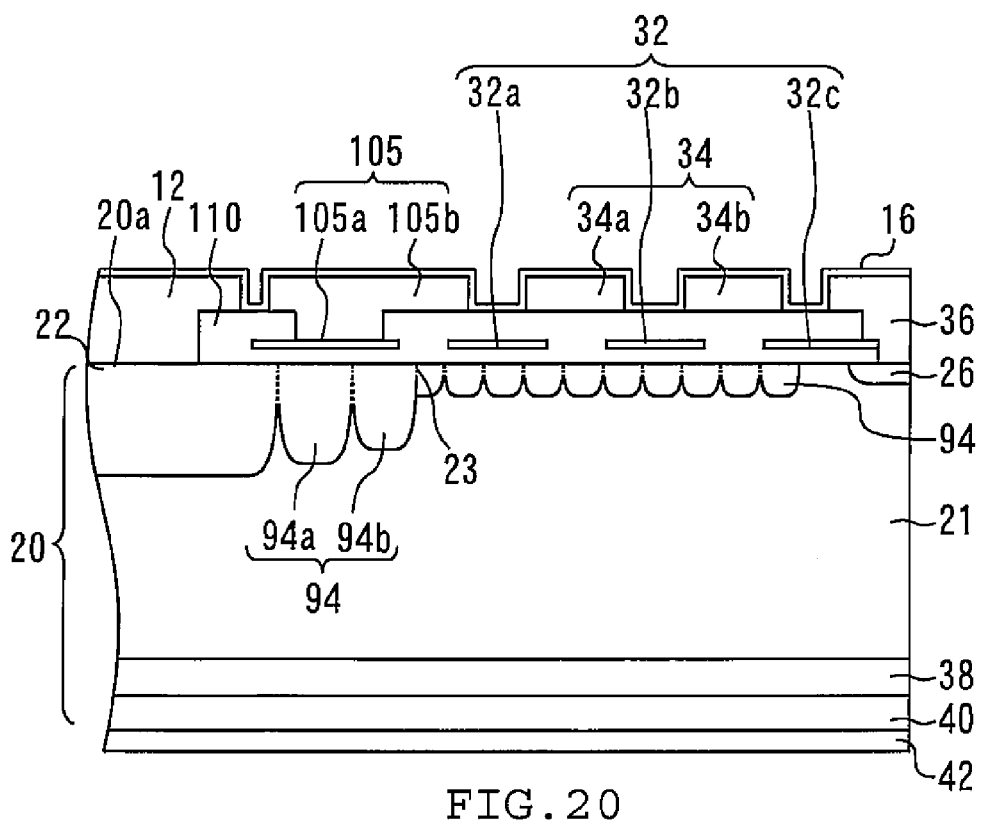
FIG. 20 is a cross-sectional view of a variation of the semiconductor device of the eighth embodiment.

FIG. 20 is a cross-sectional view of a variation of the semiconductor device of the eighth embodiment. A gate wire 105 is formed on an insulating film 110 on a concentration gradient reducing section 94 which includes p-type regions 94a and 94b. The gate wire 105 includes polysilicon 105a and aluminum 105b. The aluminum 105b extends over the insulating film 110 directly above the first boundary region 23. This semiconductor device is not provided with an emitter grounding electrode.

This semiconductor device has the same advantages as the semiconductor device of the eighth embodiment. Further, the gate wire 105, which is disposed directly above the first boundary region, provides an electric field intensity reducing effect equivalent to that of an emitter grounding electrode formed directly above the first boundary region. That is, the construction of the semiconductor device, which is not provided with an emitter grounding electrode, results in a reduced size as compared with the construction of the eighth embodiment.

Features of the semiconductor devices of different embodiments described above may be combined where appropriate to provide a semiconductor device having a reduced size and increased breakdown voltage.

As described above, all of the features of the present invention relate to the electric field reducing region; that is, the present invention is not limited to any particular construction of the device forming region. Therefore, the present invention can be applied to any semiconductor device which has an electric field reducing region formed therein for maintaining the breakdown voltage of the device. For example, the present invention may be applied to, in addition to IGBTs, MOSFETs, bipolar transistors, and diodes. Further, although the embodiments of the present invention have been described by specifying the conductivity types of the components of the semiconductor device, it is to be understood that the present invention is not limited to these particular conductivity types, and the conductivity type of each component may be either a first conductivity type or a second conductivity type.

Although in the embodiments of the invention described above the semiconductor substrate is formed of Si, it is to be understood that it may be formed of a wide bandgap semiconductor having a wider bandgap than Si. Examples of wide bandgap semiconductors include silicon carbide, gallium nitride-based materials, and diamond.

In accordance with the present invention, the electric field intensity across the RESURF layer of a semiconductor device can be made substantially uniform, making it possible to manufacture a semiconductor device of reduced size, yet having an adequately high breakdown voltage.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-283871, filed on Dec. 26, 2011 including specification, claims, drawings and summary, on which the Convention priority of the present application is based, are incorporated herein by reference in its entirety.

What is claimed is:
1. A semiconductor device comprising:
   a semiconductor substrate having a principal surface;
   a first impurity region of a first conductivity type formed in said semiconductor substrate;

a RESURF layer of a second conductivity type formed in said semiconductor substrate along said principal surface;

a well layer of said second conductivity type formed in said semiconductor substrate adjacent said RESURF layer and along said principal surface;

a channel stopper of said first conductivity type formed in said semiconductor substrate adjacent said RESURF layer and along said principal surface, with said first impurity region interposed between said channel stopper and said RESURF layer;

an insulating film formed on said principal surface and continuously covering a top surface of a first boundary region and a top surface of a second boundary region, said first boundary region including a first boundary between said well layer and said RESURF layer, said second boundary region including a second boundary between said RESURF layer and said first impurity region and facing said channel stopper;

a plurality of lower field plates formed in said insulating film in such a manner that no lower field plate lies directly above said first boundary and no lower field plate lies directly above said second boundary;

an emitter electrode formed in contact with said well layer and extending over a top surface, opposite the principal surface, of said insulating film directly above said first boundary; and a channel stopper electrode formed in contact with said channel stopper and extending over a top surface, opposite the principal surface, of said insulating film directly above said second boundary, wherein the channel stopper electrode is not in direct contact with any lower field plate.

2. The semiconductor device according to claim 1, wherein said emitter electrode overlaps a portion of said lower field plate, and said channel stopper electrode overlaps a portion of said lower field plate.

3. The semiconductor device according to claim 2, further comprising a plurality of upper field plates formed on said insulating film in such a manner that said plurality of upper field plates do not lie directly above said first and second boundary regions;

wherein a first capacitance formed between a first lower plate among said lower plates and said emitter electrode and a second capacitance formed between a second lower plate among said lower plates and said channel stopper electrode are greater than a third capacitance formed between one of said lower plates and one of said upper plates, said first lower plate being the closest of said lower plates to said first boundary region, said second lower plate being the closest of said lower plates to said second boundary region.

4. The semiconductor device according to claim 1, wherein said RESURF layer is formed of a plurality of regions of said second conductivity type.

5. The semiconductor device according to claim 1, wherein said RESURF layer is formed to have an impurity concentration of said second conductivity type which gradually decreases away from said well layer toward said channel stopper.

6. The semiconductor device according to claim 1, wherein a concentration gradient reducing section is formed in the portion of said well layer adjacent said RESURF layer in such a manner that the impurity concentration gradient of said second conductivity type between said well layer and said RESURF layer is reduced.

7. The semiconductor device according to claim 1, wherein said semiconductor substrate is formed of a wide bandgap semiconductor.

8. The semiconductor device according to claim 7, wherein said wide bandgap semiconductor is silicon carbide, gallium nitride-based material, or diamond.

9. The semiconductor device according to claim 1, wherein the insulating film is formed such that there is no direct or electrical contact between any of the lower field plates and at least one of the emitter electrode and the channel stopper electrode.

10. The semiconductor device according to claim 9, wherein the insulating film is formed such that there is no direct or electrical contact between any of the lower field plates and either of the emitter electrode and the channel stopper electrode.

* * * * *